(12) United States Patent
Yamanaka et al.

(10) Patent No.: US 6,174,364 B1
(45) Date of Patent: Jan. 16, 2001

(54) METHOD FOR PRODUCING SILICON MONOCRYSTAL AND SILICON MONOCRYSTAL WAFER

(75) Inventors: Hideki Yamanaka, Gunma-ken; Masahiro Sakurada; Shinichi Horie, both of Tokyo, all of (JP)

(73) Assignee: Shin-Etsu Handotai Co., Ltd., Tokyo (JP)

( * ) Notice: Under 35 U.S.C. 154(b), the term of this patent shall be extended for 0 days.

(21) Appl. No.: 09/232,561

(22) Filed: Jan. 15, 1999

(30) Foreign Application Priority Data

Jan. 19, 1998 (JP) .................................................. 10-021410

(51) Int. Cl.$^7$ .................................................. C30B 33/06
(52) U.S. Cl. .................................................. 117/20; 117/13
(58) Field of Search .................................................. 117/13, 15, 20

(56) References Cited

U.S. PATENT DOCUMENTS 5,919,302 * 7/1999 Falster et al. ............................ 117/13

FOREIGN PATENT DOCUMENTS

| 4-192345 | 7/1992 | (JP) . |
| 7-257991 | 9/1995 | (JP) . |
| 8-330316 | 12/1996 | (JP) . |

OTHER PUBLICATIONS

Voronkov, V.V. "The Mechanism of Swirl Defects Formation in Silicon," Journal of Crystal Growth 59 (1982), pp. 625–643.

Von Ammon, et al. "The dependence of bulk defects on the axial temperature gradient of silicon crystals during Czochralski growth," Journal of Crystal Growth 151 (1995), pp. 273–277.

Hourai, et al. "Improvement of Gate Oxide Integrity Characteristics of CZ–Grown Silicon Crystals," Progress in Semiconductor Fabrication, SEMICON/Europe 1993 Technical Conference, Geneva, 9 pp.

Nakamura, et al. "Diffusion Behavior of Point Defects in a Single Crystal of Silicon during Growth Process," Japan Crystal Growth Committee Journal, vol. 24, No. 4, pp 22–31, 1997.

Dupret, et al. "Global Modelling of Heat Transfer in Crystal Growth Furnaces," Int. J. Heat Mass Transfer, vol. 33, No. 9, pp. 1849–1871, 1990.

Shinayama, et al. "Defect Formation in the Cooling Process after CZ–Si Growth," Applied Physics, 60, pp 766–773, 1991.

Higetsu, et al. "CZ Silicon Monocrystal with excellent oxide film breakdown voltage," Japan Society of Applied Physics, 7th Crystallography Sumposition, pp 27–30, 1990.

* cited by examiner

Primary Examiner—Felisa Hiteshew
(74) Attorney, Agent, or Firm—Hogan & Hartson LLP

(57) ABSTRACT

A method for producing a silicon monocrystal according to Czochralski method characterized in growing crystal with controlling a pulling rate between a transition pulling rate Pc at which there is caused a transition from a region where excess vacancies are present, but grown-in defect is not present to a region where excess interstitial silicon atoms are present, but an agglomerate thereof is not present, and a transition pulling rate Pi from a region where excess interstitial silicon atoms are present, but an agglomerate thereof is not present to a region where an agglomerate of interstitial silicon atoms is present. There are provided a method for producing a silicon monocrystal having no defect through the whole area of the wafer and having high quality wherein a deviation of amount of precipitated oxygen is small by pulling a crystal with controlling a pulling rate P as a general and interoperable valuable, and the silicon monocrystal produced thereby.

20 Claims, 7 Drawing Sheets

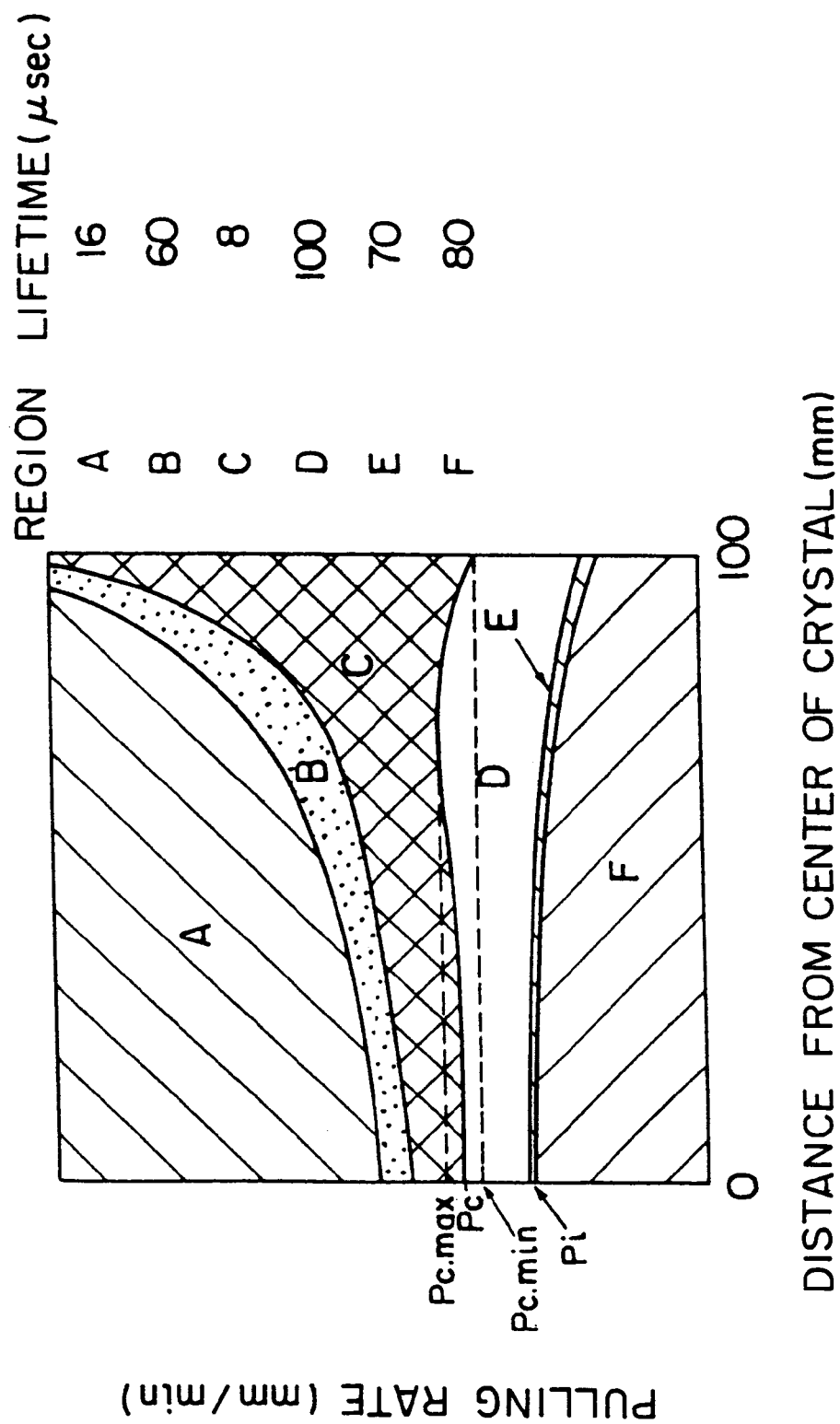

METHOD FOR PRODUCING SILICON MONOCRYSTAL AND SILICON MONOCRYSTAL WAFER

BACKGROUND OF THE INVENTION

1. Field of the Invention

The present invention relates to a method for producing a silicon monocrystal used for fabrication of a semiconductor integrated circuit device and the like, and a silicon monocrystal wafer.

2. Description of the Related Art

A silicon monocrystal wafer used as a substrate for a semiconductor integrated circuit device is manufactured mostly by the Czochralski method (CZ method). CZ method is a method wherein a seed crystal of a silicon monocrystal is immersed in a silicon melt molten at high temperature of 1420° C. or more in a quartz crucible, and then gradually pulled with rotating the quartz crucible and the seed crystal to grow a silicon monocrystal in a columnar shape. Generally, a larger diameter of a crystal to be grown results in higher solidification latent heat which is radiated on solidification of a melt, and requires a lower pulling rate. For example, the pulling rate for a crystal having a diameter of 200 mm is generally 0.40 to 1.5 mm/min. When a wafer made of the silicon monocrystal thus manufactured is subjected to a high temperature thermal oxidation treatment at 1000° C. or more, there is sometimes caused in the wafer an oxidation-induced stacking faults in a ring shape distribution (hereinafter referred to as a ring OSF).

However, in a silicon monocrystal wafer manufactured with a relatively high pulling rate, the ring OSF gets out of the wafer, or is present at the peripheral portion of the wafer, and at the inner part of the wafer, vacancies which are lattice points having no silicon atoms are incorporated excessively at a solid-liquid interface and are aggregated to grow into a observable defect on cooling of the crystal, which is referred to as a grown-in defect. Fusegawa et al. have first disclosed that the grown-in defect can be observed by using a Secco etching solution which can reveal the defect selectively (Japanese Patent Application Laid-open (kokai) No 4-192345). The defect is referred to as FPD (Flow Pattern Defect). Afterward, other methods to detect the defect have been studied to find defects such as those referred to as COP (Crystal Originated Particle), LSTD (Laser Scattering Tomograph Defect). However, recent studies have revealed that they are the same. Namely, observation and analysis using an electron microscope revealed that they are voids in a shape of an octahedron formed by aggregation of vacancies (occasionally referred to as Negative crystal).

The size of the grown-in defect is 0.2 $\mu$m at the largest, and therefore such a defect had almost no effect on yield of the device, when the degree of integration of the device was small, and the design rule was one $\mu$m or more. However, it has been revealed that the defect has adverse effect on the device when the design rule is one $\mu$m or less. When the grown-in defect exists in or near the device active layer, junction leak failure is caused. When the grown-in defect exists on the surface of the wafer, oxide dielectric breakdown voltage failure, junction leak failure or the like is caused. Accordingly it is necessary to decrease density and size of grown-in defects, or eliminate them, or prevent formation of the defects in order to cope with increase of a degree of integration in a device.

In order to prevent formation of the grown-in defect due to vacancies, there have been developed and manufactured by way of trial in about 1990 so-called low pulling speed crystal wherein a ring OSF at the peripheral portion of the wafer is constringed to a center portion of the wafer (crystal). It is well known by the manufacturers of crystal that a lower pulling rate results in a smaller diameter of the ring OSF, and the ring OSF is constringed to a center portion of the crystal at a pulling rate not higher than a certain rate. However, such lowering of a pulling rate in manufacture of a wafer has been averted, since OSF formed on the surface becomes the largest, which has adverse effect on the device formed thereon, and productivity is lowered because of low pulling speed.

In such a circumstance, Shinoyama et al. disclosed that a lower pulling rate results in constriction and elimination of the ring OSF at the center portion of the crystal (Ouyoubutsuri (Applied Physics), 60, p.766, 1991). Higetsu et al. presented that an oxide dielectric breakdown voltage failure was caused on the inside of the ring OSF of the wafer, but it was not caused on the outside thereof (at the 7th crystallography symposium of the crystallography subcommittee of Japan Society of Applied Physics, p.27, 1990). The presentation triggered development and manufacture by way of trial of low pulling speed crystal. W. V. Ammon et al. made experiments and revealed that a pulling rate at which a ring OSF is constringed at the center portion of the crystal, Pcrit (mm/min) is proportional to a temperature gradient G in the center of crystal (° C./mm) along the pulling direction, and can be given by using the following formula: Pcrit/G= 0.13 mm$^2$/° C. min, and they published it (Japanese Patent Application Laid-open (kokai) No. 7-257991, and Journal of Crystal Growth vol. 151, p. 273–277, 1995). This is the first work which experimentally shows the theory proposed by Voronkov that type and density of excessive point defect depend on P/G (V. V. Voronkov: Journal of Crystal Growth, vol. 59, p.625, 1982).

However, manufacturers of crystal have recognized that preferentially etched pits, which are completely different in a size and a shape from those of FPD, that is a grown-in defect due to vacancies, are observed on the outside of the ring OSF, or on the wafer wherein the ring OSF is constringed to be eliminated (hereafter generically referred to as outside of the ring OSF, since it is the same as the wafer wherein the region outside of the ring OSF extends all over the surface). They have not come into question at an early stage, since they have been considered as having no effect on an oxide dielectric breakdown voltage. However, it was revealed that a failure due to leakage occurred in the yield of the device. Accordingly, there arose necessity of a wafer wherein there exists no grown-in defect (hereafter referred to as LEP) which leads to the large preferentially etched pit (herein referred to as Large Etch Pit, and abbreviated to as LEP; occasionally referred to as interstitial dislocation loop, dislocation cluster, large dislocation).

It has thus revealed that completely different grown-in defects generate on the inside and the outside of the ring OSF region. As mentioned above, it is now evident that FPD which is the grown-in defect on the inside of the ring OSF is a void resulting from aggregation of vacancies. However, LEP existing at low density on the outside thereof has not yet been identified. From a comparison with the results of studies relating to grown-in defects with a floating zone method (FZ method), it is predicted that LEP is an aggregate of interstitial silicon atoms, and is a dislocation loop and a cluster thereof. They are also grown-in defects as they are formed during cooling of crystal.

As described above, the development of the wafer having none of FPD, LEP and the ring OSF has become important and necessary for the manufacturers of crystal.

Hourai et al. disclosed data implying probability of a wafer wherein none of FPD, LEP and the ring OSF exists (M. Hourai et al. :Progress in Semiconductor Fabrication, SEMICON/Europe, 1993 Technical Conference, Geneva, March/April, 1993). The data are shown in FIG. 1, which is a sketch showing approximately one fourth part of the wafer which is taken with X-ray topography after decorating grown-in defects by thermal diffusion of copper. As shown in the figure, there is a region having no grown-in defect between the ring OSF region and LEP (dislocation loop and cluster thereof) region. Namely, it was implied to form the region there exists neither FPD nor LEP (dislocation cluster) outside of the ring OSF, and to enlarge the region by controlling the crystal growing condition.

Then, Hourai et al. invented a silicon monocrystal wafer grown in accordance with CZ method at a low growth rate wherein oxidation-induced stacking fault (ring OSF) generated in a ring shape when subjected to thermal oxidation treatment disappears at a center portion of the wafer, and a dislocation cluster was eliminated all over the surface of the wafer (Japanese Patent Application Laid-open (kokai) No. 8-330316). Further, they proposed that such a wafer can be produced when controlling P/G value is controlled to 0.20–0.22 mm$^2$/° C. min, in which P is a pulling rate (mm/min), and G is an average intra-crystal temperature gradient (° C./mm) along the pulling direction (° C./mm).

They stated therein that a ring OSF converges to the center of a wafer when P/G is 0.22 mm$^2$/° C. min. This value is 1.7 times as large as the value according to Von Ammon et al. mentioned above. According to the presentation by Nakamura et al., Pcrit/G is 0.15 mm$^2$/° C. min (Japan crystal growth committee journal, Vol.24, No.4, p22, 1997). As described above, the value of Pcrit/G varies widely depending on presenters.

It is not sure that the wafer proposed by Hourai et al. can be actually produced. However, it is the fact that there is a region where none of dislocation cluster and FPD exists on the outside of the ring OSF, as shown in a photograph (See FIG. 1) disclosed in 1993, as mentioned above.

As described above as a recent technology for reduction and elimination of grown-in defects due to vacancies and interstitial silicon atoms, a crystal defect in a crystal having seriously important effects on a device than before is an oxide precipitate, and therefore the technology of controlling it is important in a device processing. Recently, a device heat process tends to be conducted at lower temperature, and thus it is more important to control the density of the oxide precipitate.

Since a quartz crucible is used in CZ method, oxygen is dissolved in a silicon melt from the quartz crucible, and then incorporated in the crystal, which is supersaturated on cooling of the crystal, resulting in aggregation of oxygen. Aggregation is accelerated most around 650° C. and around 500° C. Accordingly, nuclei formation of the oxide precipitates is affected by low temperature thermal history on cooling the crystal, and thus an upper part and a lower part of the grown crystal are significantly different in density of nuclei of oxide precipitate. Of course, the density of nuclei of oxide precipitate depends on a concentration of supersaturated oxygen incorporated in the crystal, and is increased with increase thereof. Accordingly, precise control of the supersaturated oxygen concentration is required in manufacture of a wafer.

The nuclei of oxide precipitate formed while producing crystal grows a larger oxide precipitate, as supersaturated oxygen precipitates on the nuclei during a device thermal process. The oxide precipitate plays an important role of gettering of heavy metal impurity from outside such as an apparatus during a device fabrication process. On the other hand, when the precipitates are formed in high density, they are present also in or near a device active layer, and may cause a junction leakage failure. In a conventional thermal process, high temperature treatment at 1200° C. is performed in a relatively early stage. A considerable amount of nuclei of oxide precipitate formed in manufacture of crystal are dissolved again, so that there is eliminated the difference of density of nuclei of oxide precipitate latently contained in wafers between wafers, namely between crystals or positions of crystals. Recently, heat treatment in an early stage is performed at lower temperature of 1000–1050° C., and thus nuclei of oxide precipitate formed in manufacture of crystal is not dissolved, but grows. Control of density of nuclei of oxide precipitate is therefore getting more important. Accordingly, there is a need for the invention relating to suppress deviation of density of nuclei of oxide precipitate between wafers which is formed in manufacture of crystal.

As described above, when the pulling rate is lowered, the diameter of the ring OSF gets small. Accordingly, it is well known for the person skilled in the art of manufacture of the crystal in the manufacturer of crystal that a ring OSF converges to the center of a wafer and disappears. It is also known that a void which is an agglomerate of vacancies is formed as a grown-in defect. Furthermore, it is also known as presented by Hourai et al., that LEP (dislocation loop and cluster thereof) which is an agglomerate of interstitial silicon atoms is formed on the outside of a ring OSF. Hourai et al. evolve the finding that there is a region where the grown-in defect, FPD, is not present between peripheral portion of the ring OSF and LEP region outside thereof, and suggest enlarging the region all over the surface of the wafer.

According to the invention of Hourai et al., the method of enlarging the region having no defect all over the surface of the wafer or throughout the crystal is defined by the range of P/G, and G cannot be general value in the manufacturers of crystal, since C is not an actual value on growing crystals, but a value according to total heat transmission analysis simulation. As described above, it is backed up by the fact that Pcrit/G value at which the ring 0SF converges to the center of a wafer varies depending on organizations. G varies depending on simulation software developed by each organization and commercially available simulation software (for example a software called "FEMAC"; F. Dupret et al; Journal of Heat transfer, vol. 33, p. 1849, 1990). G varies also depending on a way of making finite element mesh, the condition of boundary, and the way of defining gradient.

Accordingly, the value P/G is not suitable for the variable which is to be controlled in general and interoperable way during crystal growing. Generally, G is not a variable to be controlled during crystal growing, but a parameter given for a heat insulating structure within the furnace, which is difficult to be altered or controlled during pulling crystal. Absolute value thereof is not general nor interoperable, and thus G determined by simulation should be used as a relative value in each organization. On the other hand, a pulling rate is a common variable among any organizations, and is controlled actually, so that it is suitable as a variable.

There is neither theory nor experimented facts that completely contradict the theory of Voronkov that a type and an amount of excessive point defects depend on P/G value. However, the theory provides neither a specific critical value at which types of point defect is transited, nor P/G value at which a grown-in defect which is an agglomerate of point defects generates. Even if there can be provided results of experiment that a transition point is determined only by P/G value, it is quite difficult to prove that it transits at the same P/G value for any heat insulating structures within the furnace. Because, G value varies depending on analyzing organization, and is not interoperable nor general.

Under the circumstance, if there can be found a general method determining a boundary between a region of forming grown-in defects and a region having no defects not by P/G value but by a pulling rate P, it will be quite effective in actual crystal manufacturing, and it will be interoperable among organizations, as it is a general method, and furthermore it will be simple and practical.

As mentioned above, Hourai et al evolve the finding that there is a region where the grown-in defect, FPD, is not present between peripheral portion of the ring OSF and LEP region outside thereof, and suggest enlarging the region all over the surface of the wafer. However, oxygen precipitation behavior in the region is not clarified.

If the transition point of excessive point defects is in the region having no defect, there exists a region having excess vacancies in the region having no defect, which may results in extroadinaly large amount of precipitated oxygen. Because, amount of precipitated oxygen depends on density of excess vacancies and density of excess interstitial silicon atoms.

As shown in the following formula, generation of oxide precipitate (for example, $SiO_2$) is promoted when the density of vacancy is excessive, and suppressed when the density of interstitial silicon atom is excessive.

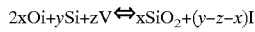

$$2xOi+ySi+zV \Leftrightarrow xSiO_2+(y-z-x)I$$

wherein Oi represents interstitial oxygen atom, Si represents a silicon atom at a lattice point, V represents vacancy, I represents interstitial silicon atom, each of x, y and z represents a concentration.

It can be proved qualitatively as follows. When oxide precipitate is formed in silicon mother crystal, the volume is expanded to 2.25 times. Interstitial silicon atoms are liberated to correct the lattice distortion thus generated. If excess vacancies are present, oxygen precipitation can be accelerated, as the liberated interstitial silicon atoms can be absorbed. If excess interstitial silicon atoms are present, oxygen precipitation is suppressed, as the liberated interstitial silicon atoms are not absorbed.

The region wherein oxygen precipitation is accelerated and the region wherein oxygen precipitation is suppressed may be different in deviation of an amount of precipitated oxygen. Namely, it is predicted that the former is easily affected by thermal history, and the latter is hardly affected by thermal history.

From the aspect of designing device process, difference in density of oxide precipitates is one of problems which are should be avoided most. It is necessary to avoid deviation of density of oxide precipitates among wafers.

SUMMARY OF THE INVENTION

The present invention has been accomplished to solve the above-mentioned problems, and an object of the present invention is to provide a method of producing a silicon monocrystal having high quality wherein there is no grown-in defect anywhere of the surface of the wafer, and deviation of amount of precipitated oxygen is small comprising finding an optimum region by clarifying a transition point of excessive point defect region and a transition point of generation of ring OSF and grown-in defect using a pulling rate P as a general and interoperable valuable, and pulling a crystal with controlling a pulling rate in the range corresponding to the region; the silicon monocrystal manufactured by the method; and the silicon monocrystal wafer.

To achieve the above mentioned object, the present invention relates to a method of producing a silicon monocrystal comprising growing crystal in the region where excess interstitial silicon atoms are present, but an agglomerate thereof is not present.

When the crystal is grown only in the region where excess interstitial silicon atoms are present, but an agglomerate thereof is not present as mentioned above, there can be provided a silicon monocrystal containing excess interstitial silicon atoms all over the silicon monocrystal, but containing no extraordinary oxygen precipitation region due to excess vacancies, and containing no grown-in defect which is an agglomerate of vacancies and no agglomerate of interstitial silicon atoms, and containing no crystal defect which constitutes nuclei of oxidation-induced stacking fault formed on thermal oxidation treatment.

In another aspect, the present invention relates to a method of producing a silicon monocrystal according to Czochralski method comprising growing crystal with controlling a pulling rate between a transition pulling rate Pc at which there is caused a transition from a region where excess vacancies are present, but grown-in defect is not present to a region where excess interstitial silicon atoms are present, but an agglomerate thereof is not present, and a transition pulling rate Pi from a region where excess interstitial silicon atoms are present, but an agglomerate thereof is not present to a region where an agglomerate of interstitial silicon atoms is present.

When the crystal is grown with controlling the pulling rate in such a manner, a silicon monocrystal having desired quality can be obtained easily and reliably without uncertain simulation analysis or the like, although the crystal may be grown only in the region where excess interstitial silicon atoms are present, but an agglomerate thereof is not present as mentioned above with controlling an average intra-crystal temperature gradient (° C./mm) along the pulling direction or other factors.

In this case, when a transition point from a region where excess vacancies are present, but grown-in defect is not present to a region where excess interstitial silicon atoms are present, but an agglomerate thereof is not present varies depending on a radial position of the crystal, it is necessary to grow a crystal with controlling a crystal pulling rate in the range between the lowest transition pulling rate among the transition pulling rate corresponding to the transition point (Pc. min) and the highest transition pulling rate among the transition point from a region where excess interstitial silicon atoms are present, but an agglomerate thereof is not present to a region where an agglomerate of interstitial silicon atoms is present (Pi max).

Generally, a transition point from a region where excess vacancies are present, but grown-in defect is not present to a region where excess interstitial silicon atoms are present, but an agglomerate thereof is not present often varies depending on a radial position of the crystal. In such a circumstance, a wafer having no defect all over the surface thereof cannot be obtained unless the crystal is grown with controlling the pulling rate between the above-mentioned Pc. min and Pi. max.

When the transition point from a region where excess vacancies are present, but grown-in defect is not present to a region where excess interstitial silicon atoms are present, but an agglomerate thereof is not present varies depending on a radial position of the crystal, it is possible to make the rate of difference between the highest transition pulling rate among the transition point corresponding to the transition point(Pc max) and the lowest transition pulling rate among the transition pulling rate corresponding to the transition point(Pc. min) to Pc. min 0 to 7%, and to make the rate of the difference between the maximum in a radial direction of a temperature gradient right above the interface between the silicon melt and the crystal along the pulling direction G (G max) and the minimum thereof (G min) to the G min 20% or less.

As described above, when the transition point varies depending on a radial position of the crystal, under the above-mentioned condition as for Pc. max and Pc. min, or the above-mentioned condition as for Gmax and Gmin, it is possible to control a pulling rate to grow a crystal having desired quality wherein there exists only region where excess interstitial silicon atoms are present, but an agglomerate thereof is not present.

The specific value of Pc and Pi; as well as Pc.max, Pc.min and Pi.max can be determined by growing a monocrystal by pulling a crystal with gradually lowering a pulling rate in pulling of monocrystal which is performed in advance, slicing a sample at a longitudinal section which passes through a central axis of the crystal and is parallel to an axial direction of crystal growth, subjecting it to an etching treatment in order to eliminate a surface damage, followed by subjecting it to a heat treatment for oxygen precipitation, and then determining distribution of defect in the sample, or measuring lifetime of minority carrier to determine the distribution of the lifetime in the sample.

According to such a method, it is possible to determine the value of Pc and Pi; as well as Pc.max, Pc.min and Pi.max easily and correctly in any type of heat insulating structure in furnace in principle. Moreover, the crystal having desired quality can surely be obtained by growing the crystal with controlling the pulling rate in accordance with the value thus determined, without any of complicate calculation, simulation based on uncertain factors or incorrect presupposition.

As described above, according to the method of the present invention, there can be efficiently provided a silicon monocrystal having a quality that there exists only a region where excess interstitial silicon atoms are present, but an agglomerate thereof is not present. The wafer made of the silicon monocrystal contains excess interstitial silicon atoms all over the wafer, has no extraordinary oxygen precipitation region due to excess vacancies, and has none of grown-in defect which is an agglomerate of vacancies, an agglomerate of the interstitial silicon atoms, and a crystal defect which becomes a nuclei of oxidation-induced stacking fault formed when subjected to the thermal oxidation treatment.

As explained above, since the silicon monocrystal and the silicon monocrystal wafer of the present invention contain none of grown-in defect which is an agglomerate of points defect formed during cooling of crystal. (voids called FPD, COP, and dislocation loop and cluster thereof) and a nuclei of oxidation-induced stacking fault through the whole area, oxide dielectric breakdown voltage failure and junction leak failure are reduced. Furthermore, since extraordinary (high density) oxygen precipitation does not generate, there is no deviation of amount of precipitated oxygen between wafers, so that device heat process can be easily designed, and further high density oxide precipitates does not generate so that junction leak failure due to it can be prevented. Accordingly, yield of a semiconductor integrated circuit device having high degree of integration is improved. According to the method for producing a silicon monocrystal of the present invention, a condition for producing the silicon monocrystal can be defined only by a pulling rate without a temperature gradient G obtained by simulation. Therefore, the method for producing a silicon monocrystal of the present invention is general and interoperable, and can be utilized widely, so that it contributes to industrial production.

BRIEF DESCRIPTION OF THE DRAWINGS

FIG. 7 is a defect distribution chart and value of lifetime obtained in the example.

DESCRIPTION OF THE INVENTION AND A PREFERRED EMBODIMENT

The present invention will be further described below in detail.

In the present invention, a transition point of types of point defects for a crystal growing rate, a transition point of grown-in defect region, and a transition point of ring (DSF region are determined at first as follows.

A crystal is grown with gradually decreasing a pulling rate at a constant decreasing rate of the pulling rate $\gamma$ (mm/min/cm), and a sample is sliced at a longitudinal section which passes through a central axis of the crystal and is parallel to an axial direction of crystal growth. The sample is immersed in the mixed acid solution consisting of hydrofluoric acid (HF) and nitric acid ($HNO_3$) to remove processing damage incorporated on slicing. Then, the sample is subjected to heat treatment for oxygen precipitation, analyzed by X-ray topography to determine distribution of defect in the sample, or measured minority carrier lifetime to determine distribution of lifetime in the sample, and thereby each transition point can be determined by a distribution chart.

Although the pulling rate is gradually decreased at a constant decreasing rate of the pulling rate in the above-mentioned method, the constant decreasing rate is not always essential. However, the constant decreasing rate is convenient for relative evaluation of the crystal grown under each condition.

Figure 1:
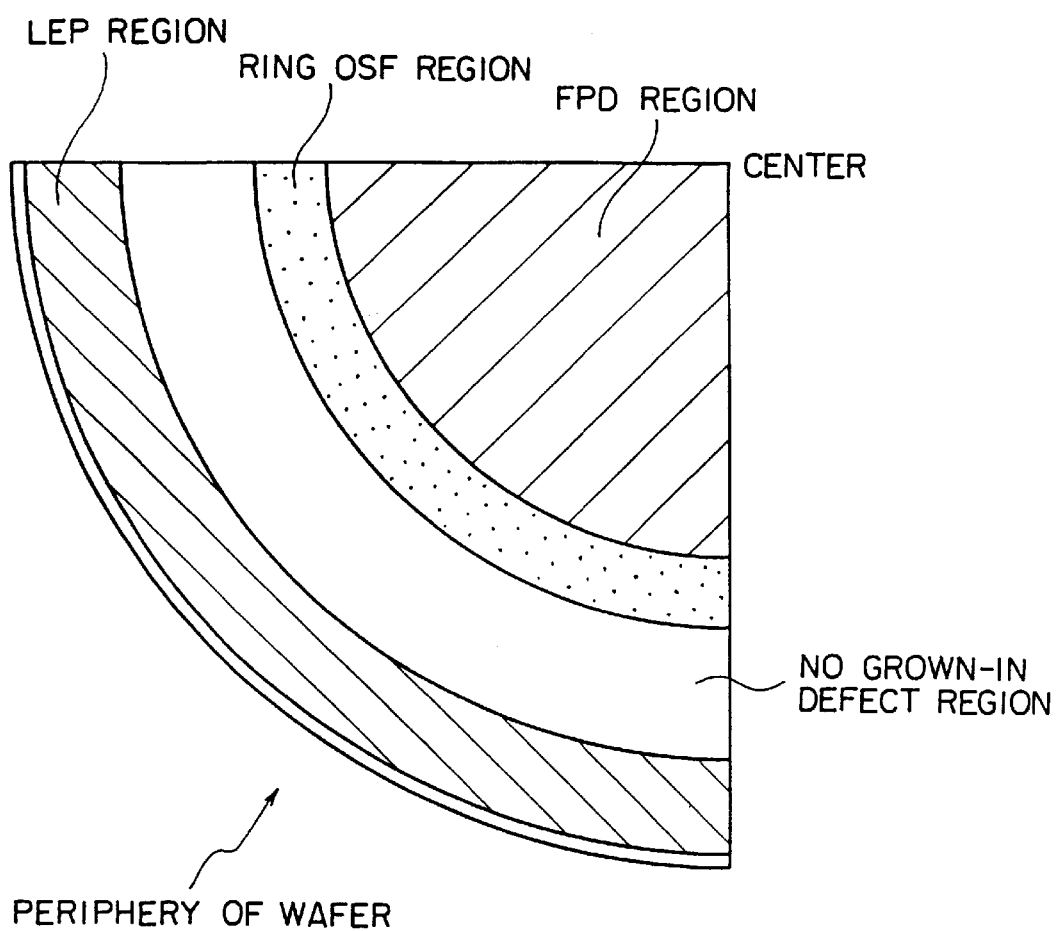
FIG. 1 is a sketch showing existence of no defect region between a ring OSF region and LEP (a dislocation loop and a cluster thereof) region.
Figure 2:
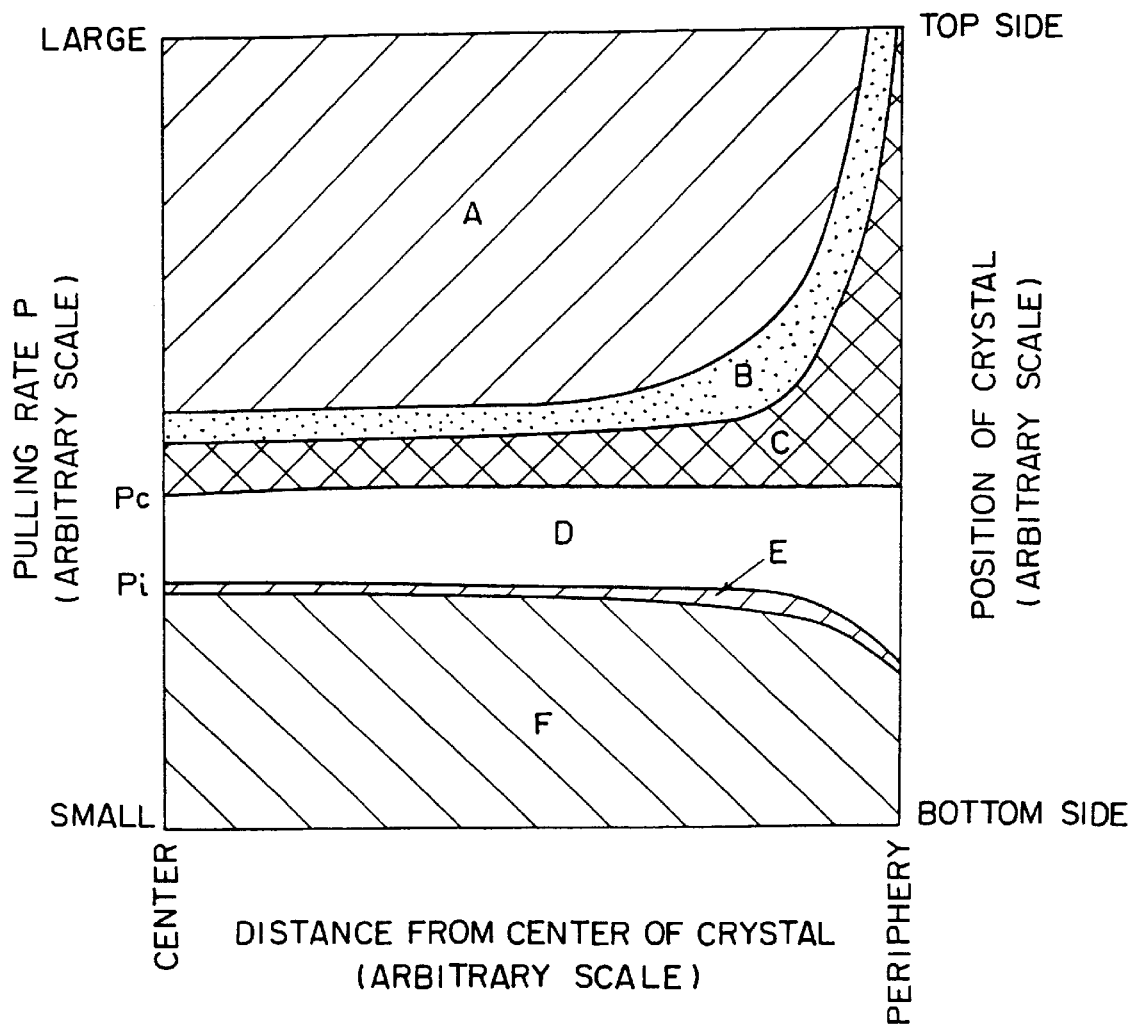
FIG. 2 is a defect distribution chart which shows defects in a crystal grown with gradually decreasing a pulling rate at a constant changing rate wherein the horizontal axis is position of a radial direction of the crystal and the vertical axis is a pulling rate (a position of the body of the crystal).

FIG. 2 shows one example of the defect distribution thus obtained. The region A is the region where grown-in defect FPD is formed. It is confirmed by subjecting to Secco-etching the above-mentioned sample which is not subjected to heat treatment for oxygen precipitation, and observing the surface. The region B is a region where a ring OSF is formed. The region C is a region where none of grown-in defects of FPD and LEP, that is, no defect region, but oxygen precipitation generates. The region D is also a region where none of grown-in defects of FPD and LEP, that is, no defect region, and oxygen precipitation scarcely generates (which is a region having desired quality of the present invention). The region E is a region where LEP begins to be formed, and oxygen precipitation slightly generates. The region F is a region where a grown-in defect LEP is observed and oxygen precipitation scarcely generates.

Comparing amount of precipitated oxygen by comparing strength of contrast of X-ray topography image and lifetime of minority carrier, the order of the regions in size is as follows: the region C (the largest), the region A, the region E, the region B, the region D and F (the smallest). As described above, oxygen precipitation is suppressed when excess interstitial silicon atoms are present, and thus it can be decided that the regions D, E and F where oxygen precipitation is suppressed are the regions where excess interstitial silicon atoms are present. Accordingly, there are the region where excess interstitial silicon atoms are present and the region where excess vacancies are present in no defect region, and the boundary of them can be decided by measuring the difference of amount of precipitated oxygen or the lifetime of minority carrier. In the method of the present invention, distribution chart of defects is prepared as described above, and the pulling rate factor is decided therefrom.

A method of producing a silicon monocrystal of the present invention, and a silicon monocrystal and a silicon monocrystal wafer obtained thereby will be hereunder described.

Figure 3:
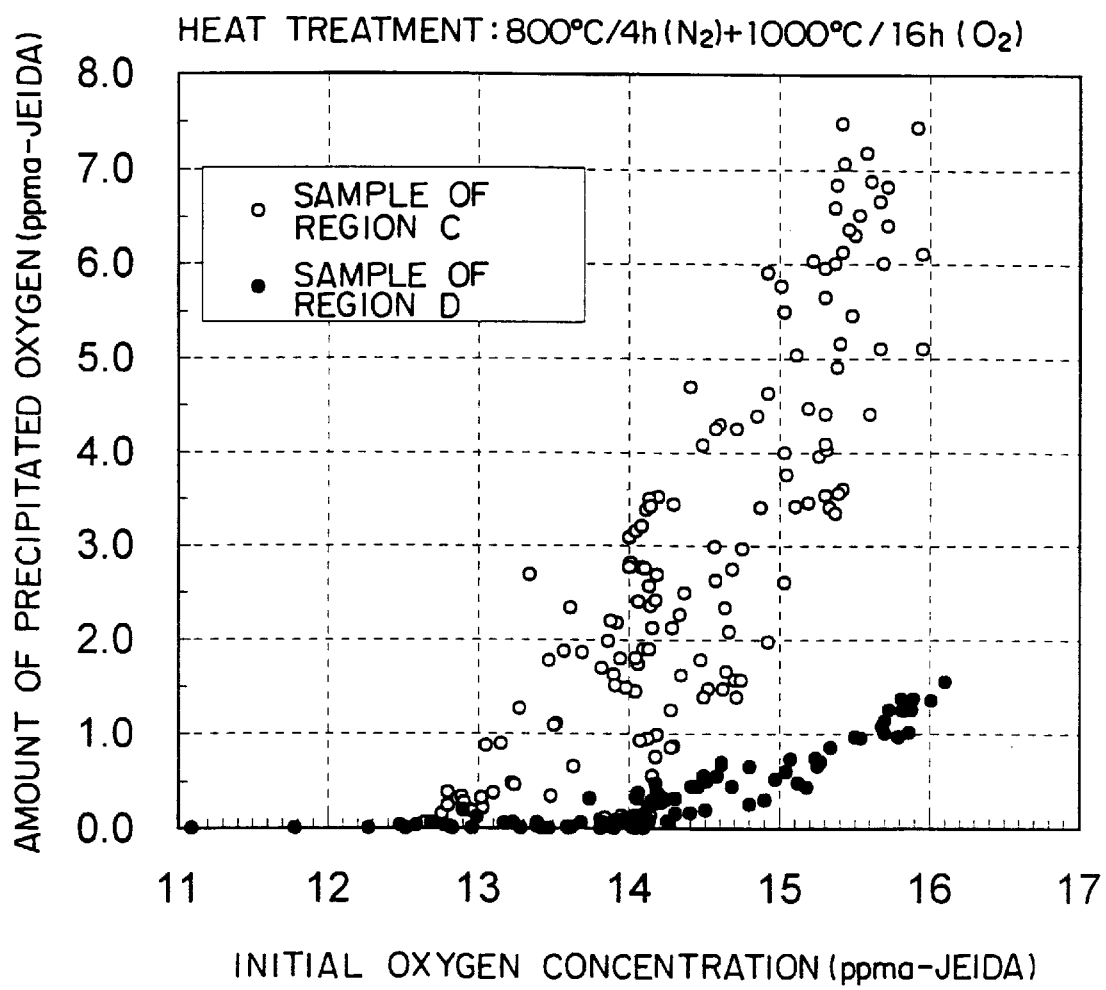
FIG. 3 is a explanatory view showing oxygen precipitation behavior of a sample sliced from the crystal grown at a pulling rate in the region C and the region D among the no defect region shown in FIG. 2. The region C is represented by a white circle. The region D is represented by a black circle.

Amount of precipitated oxygen of a lot of samples prepared with the pulling rate corresponding to the region C and the region D shown in FIG. 2 which are no defect regions were measured and shown in FIG. 3. The amount of precipitated oxygen in the region C is represented by white circles, which are numerous and dispersed widely. The amount of precipitated oxygen in the region D is represented by black circles, which are suppressed and few, and dispersed little. The latter shows an ideal behavior that amount of precipitated oxygen is defined only by initial oxygen concentration.

As described above, according to the present invention, a silicon monocrystal and silicon monocrystal wafer having desired properties can be manufactured by pulling the crystal in the range of the region D. Namely, there can be realized a silicon monocrystal and a silicon monocrystal wafer which is manufactured by Czochralski method, wherein there are excess interstitial silicon atoms over all, and there is none of extraordinary oxygen precipitation area due to excess vacancies, grown-in defect which is agglomerate of vacancies and an aggregate of interstitial silicon atoms, as well as crystal defect which constitutes a nuclei of oxidation-induced stacking fault formed on thermal oxidation treatment.

In an aspect of a pulling rate, at the boundary between the region C and the region D in FIG. 2, there occurs a transition from a region where excess vacancies are present, but grown-in defect is not present, that is, the region of extraordinary oxygen precipitation to a region where excess interstitial silicon atoms are present, but an agglomerate thereof is not present. Pc is defined as a pulling rate at the time when the transition occurs. At the boundary between the region D and the region E, there occurs a transition from a region where excess interstitial silicon atoms are present, but an agglomerate thereof is not present to a region where an agglomerate of interstitial silicon atoms is present. Pi is defined as a pulling rate at the time when the transition occurs.

Accordingly, the silicon monocrystal and the silicon monocrystal wafer having desired quality of the present invention can be manufactured by pulling the crystal with controlling the pulling rate in between the transition pulling rate Pc at which there occurs the transition from the region where excess vacancies are present, but grown-in defect is not present, namely, the region of extraordinary oxygen precipitation to the region where excess interstitial silicon atoms are present, but an agglomerate thereof is not present and the transition pulling rate Pi at which there occurs the transition from a region where excess interstitial silicon atoms are present, but an agglomerate thereof is not present to a region where an agglomerate of interstitial silicon atoms is present.

When conducting the above-mentioned operation in each heat insulating structure in furnace, it is possible in principle to find Pc and Pi, and grow crystal with controlling the pulling rate in the range to provide a silicon monocrystal and silicon monocrystal wafer having quality desired in the present invention in any pulling apparatus, and in any structure in furnace. Moreover, since control is done as for the pulling rate, an apparatus generally used in a pulling machine can be utilized, and any special apparatus are not necessary to carry out the present invention.

The state shown in FIG. 2 is obtained when a heat insulating structure in furnace is optimized, but a transition pulling rates Pc and Pi vary in a radial direction of crystal in many cases.

Figure 4:
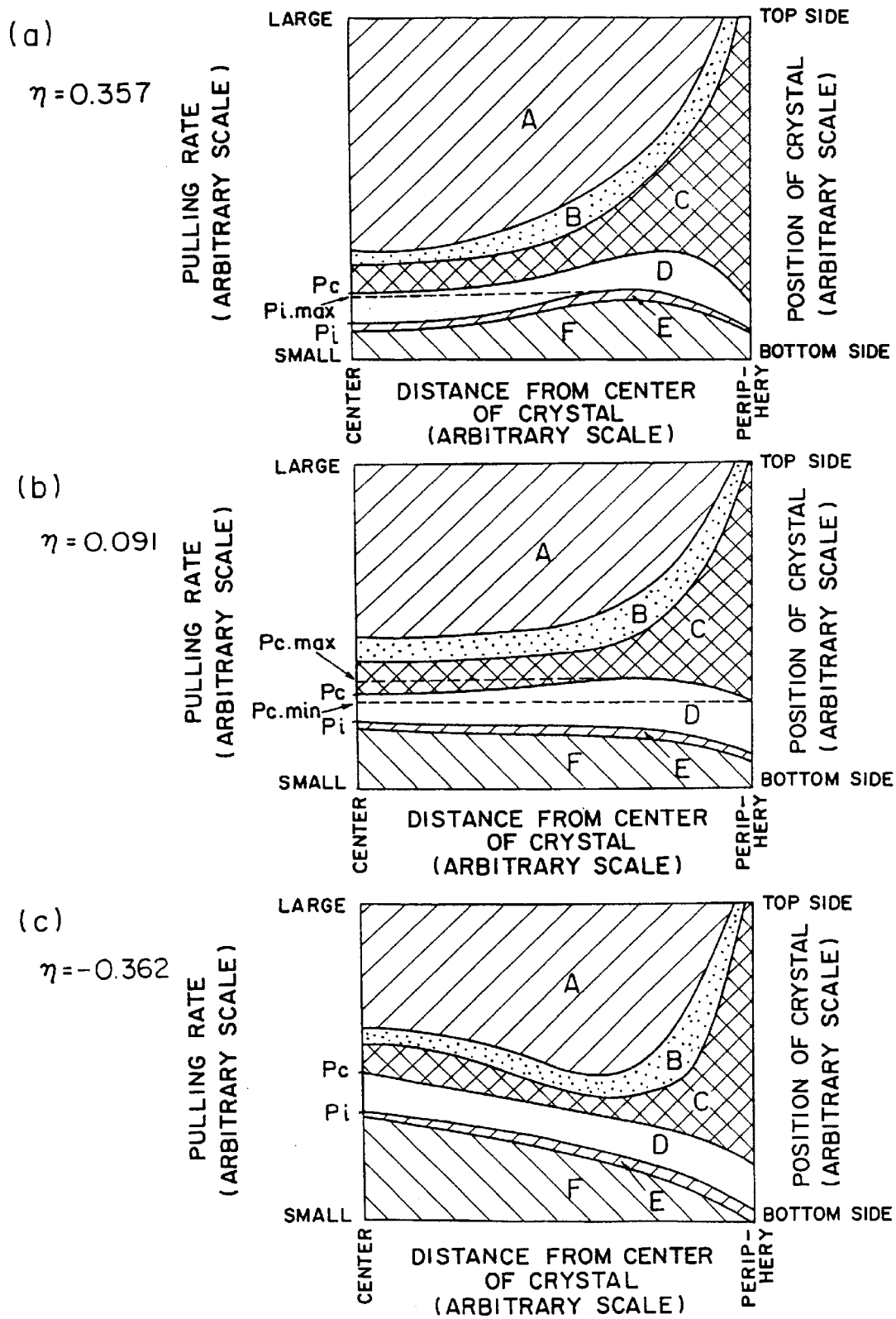
FIG. 4 is a defect distribution chart which shows defects in a crystal grown with gradually decreasing a pulling rate at a constant changing rate in three kinds of heat insulating structure in furnace wherein the horizontal axis is a position of a radial direction of the crystal and the vertical axis is a pulling rate (a position of the body of the crystal). (a) shows the case that temperature gradient along the pulling direction on the surface of the crystal is larger than temperature gradient along the pulling direction in the center of the crystal. (b) shows the case that temperature gradient along the pulling direction on the surface of the crystal is slightly larger than temperature gradient along the pulling direction in the center of the crystal. (c) shows the case that temperature gradient along the pulling direction on the surface of the crystal is smaller than temperature gradient along the pulling direction in the center of the crystal.

Typical examples that the transition pulling rates varies in a direction of a diameter of crystal are shown in FIG. 4(a), (b) and (c). These are performed in three kinds of different heat insulating structure in furnace and determined by the method described above to provide a distribution graph of grown-in defect wherein X axis is a radial direction of the crystal and Y axis is a pulling rate.

As an index showing relative difference of heat insulating structure in furnace, a temperature gradient right above the interface between the silicon melt and the crystal along the pulling direction determined by FEMAG simulation software is used. It is found that the ratio η of the difference ΔG between the value on the surface of the crystal (peripheral, or vicinity) (Gs) and the value in the center of the crystal (Gc) to the smaller value of the value on the surface of the crystal or the value in the center of the crystal varies widely.

FIG. 4(a) shows the case that a temperature gradient along the pulling direction on the surface of the crystal is larger than a temperature gradient along the pulling direction in the center of the crystal, and η=0.357. FIG. 4(b) is the case that a temperature gradient along the pulling direction on the surface of the crystal is slightly larger than a temperature gradient along the pulling direction in the center of the crystal, and η=0.091. FIG. 4(c) shows the case that a temperature gradient along the pulling direction on the surface of the crystal is smaller than a temperature gradient along the pulling direction in the center of the crystal, and η=0.362.

In the case of FIG. 4(a), there is no pulling rate fall under the region D over all in radial direction of crystal. In the case of FIG. 4(b), namely, when η is positive and small, it is close to an ideal distribution as shown in FIG. 2. In the case of FIG. 4(c), as same as FIG. 4(a), there is no pulling rate fall under the region D over all in the radial direction of crystal.

As described above, when the transition point from the region where excess vacancies are present, but grown-in defect is not present to the region where excess interstitial silicon atoms are present, but an agglomerate thereof is not present varies depending on the radial direction of crystal, the crystal needs to be grown with controlling the pulling rate in the range between the smallest transition pulling rate (Pc.min) among the transition pulling rates corresponding to the transition point and the largest transition pulling rate (Pi.max) among the transition pulling rates corresponding to the transition point from a region where excess interstitial silicon atoms are present, but an agglomerate thereof is not present to a region where an agglomerate of interstitial silicon atoms is present.

Studying further as for heat insulating structure in furnace in which the value η which is relatively closed to the value shown in FIG. 4(b), it has been found that the ratio of the difference between the largest transition pulling rate (Pc.max) among the transition point corresponding to the transition point and the smallest transition pulling rate (Pc.Min) to Pc.min needs to be in the range of 0% to 7% for presence of the pulling rate fall under the region D all over the crystal in radial direction.

It is also found that the ratio of the difference between the maximum value (Gmax) and the minimum value (Gmin) in a radial direction of a temperature gradient right above the interface between the silicon melt and the crystal along the pulling direction G to Gmin needs to be 20% or less for presence of the pulling rate fall into the region D over all in the radial direction of the crystal.

Figure 5:
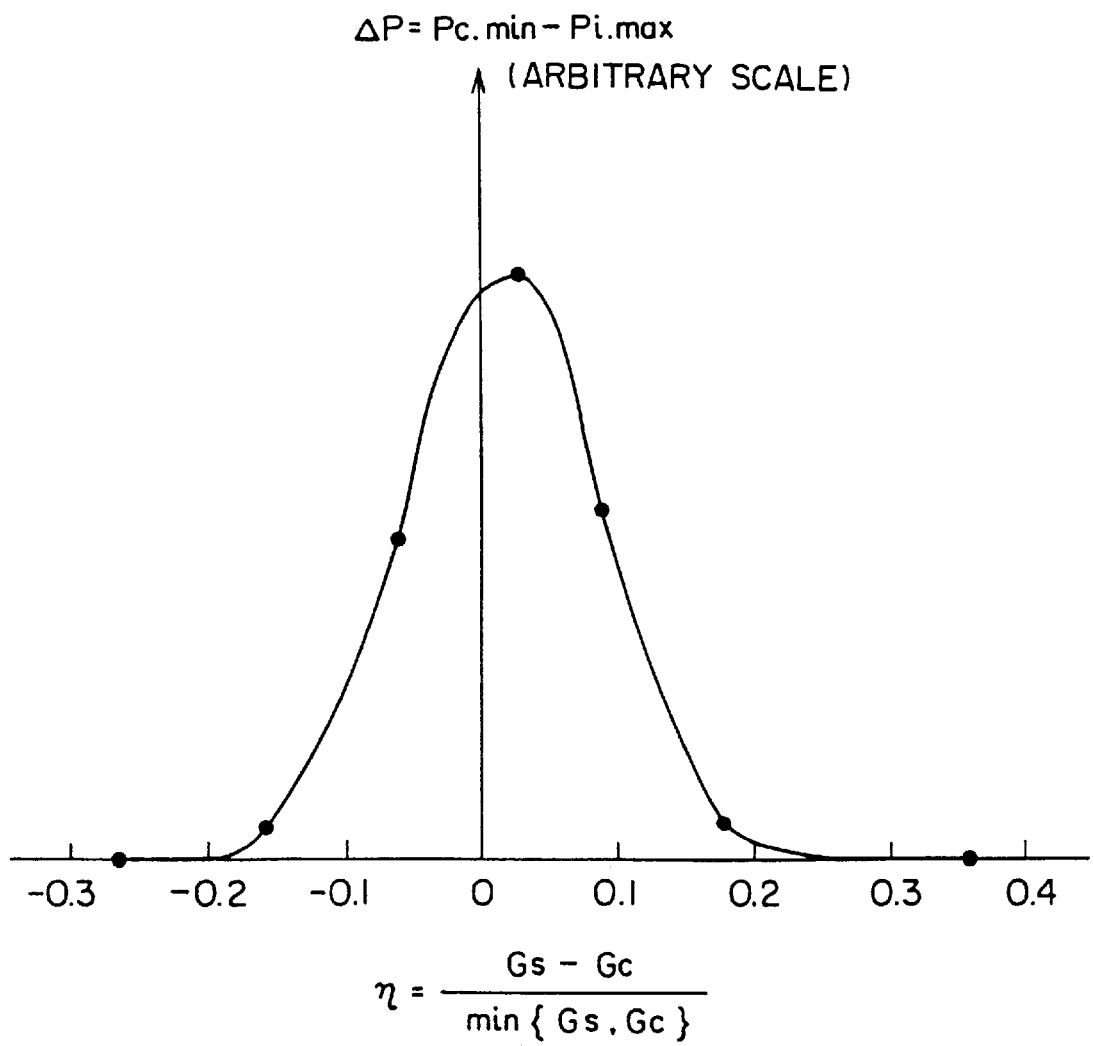
FIG. 5 is a graph showing relation with the range of pulling rate $\Delta P = Pc.min - Pi.max$ at which region (D) shown in FIG. 2 can be realized and $\eta$ as for a crystal grown with gradually decreasing a pulling rate at a constant changing rate in various kinds of heat insulating structure in furnace.

Namely, FIG. 5 shows a result obtained by examining the relation between the range of the pulling rate for the region D: ΔP=Pc.min−Pi.Max and η with gradually decreasing the pulling rate at a constant rate.

As shown in FIG. 5, whether η is positive or negative, ΔP becomes 0 unless the ratio is 20% or less.

During growing the crystal, when the full length of the crystal is pulled with controlling the pulling rate P between Pc and Pi, or Pc.min and Pi.max, there can be obtained the crystal wherein only the region according to the present invention where excess interstitial silicon atoms are present, but the agglomerate thereof is not present all over an monocrystal ingot.

The silicon monocrystal and the silicon monocrystal wafer of the present invention thus obtained contains excess interstitial silicon atoms over all, and thus there occurs no extraordinary oxygen precipitation due to vacancies, and show oxygen precipitation behavior that amount of precipitated oxygen by heat treatment is defined only by an initial oxygen concentration. Accordingly, since amount of precipitated oxygen in the heat treatment process of a device process can be determined by initial oxygen concentration, deviation of amount of precipitated oxygen can be reduced. Furthermore, there is not produced the wafer where oxygen precipitation occurs excessively, it becomes easy to design of device heat process.

Moreover, since there is no grown-in defects such as FPD which is an agglomerate of vacancies or LEP (considered as dislocation loop and the cluster thereof) which is agglomerate of interstitial silicon atoms and a nuclei of oxidation-induced stacking fault, there can be reduced junction leak failure and oxide dielectric breakdown voltage failure. Of course, since amount of precipitated oxygen can be controlled, excess oxygen precipitation can be prevented, there can also be reduced junction leak failure and oxide dielectric breakdown voltage failure due to oxide precipitate.

In recent years, high temperature heat treatment in hydrogen atmosphere is sometimes carried out to dissolve oxide precipitate in the vicinity of the surface layer. However, thermal stress higher than critical shear stress is applied to the wafer in such a high temperature treatment, resulting in generation of slip dislocation, or metal impurity contamination may generate by the material inside of the heat treatment furnace, which leads to low yield and low productivity. Furthermore, in some high temperature heat treatment in hydrogen atmosphere, there can be eliminated only grown-in defect FPD (sometimes referred to as COP) to the depth of several micron from the surface. The grown-in defect LEP cannot be eliminated by the hydrogen heat treatment even in the surface layer. Accordingly, the wafer of the present invention has higher quality than such a wafer subjected to high temperature heat treatment in hydrogen atmosphere.

According to the present invention, the nuclei of oxide precipitate in the grown crystal is relatively few, and oxygen precipitation by the following heat treatment can be suppressed. Therefore, it may be considered that it is unsuitable for intrinsic gettering method. However, it does not become a problem, since, in a general fabrication of the wafer, it is well known that a heat treatment is carried out at low temperature of 650° C. or the like in order to eliminate oxygen donor formed during cooling of the crystal, and an amount of precipitated oxygen which is necessary during the device heat process can be controlled by controlling the time for the treatment. Moreover, because of improvement in cleanliness of the device process, necessary amount of precipitated oxygen is decreased. Since deviation of amount of precipitated oxygen is small in the wafer of the present invention, on determining heat treatment time at 650° C., only by measuring an initial oxygen concentration, heat treatment time can be determined as only one value.

In the method of producing a silicon monocrystal of the present invention, an intra-crystal temperature gradient G which is different depending on analysis organizations is not necessary to be used, and therefore is general and interoperable. Namely, crystal is grown with gradually decreasing the pulling rate, a distribution of defects to a position in radial direction of crystal and a pulling rate are determined to define and relatively compare Pc, Pi, Pc.max, Pc.min, Pi.max, Pi.min and the like. Even for a pulling apparatus and heat insulating structure in furnace newly designed, propriety to the method of the present invention can be decided by growing crystal with gradually decreasing the pulling rate, determining a distribution of defects to a position in radial direction of crystal and compare the value of ΔP=Pc.min−Pi.max. As shown in FIG. 5, from the relation between ΔP=Pc.min−Pi.max and η=(Gs−Gc)/min {Gs, Gc}, it can be decided whether Gc or Gs should be increased to increase ΔP, so that more ideal pulling apparatus and heat insulating structure in furnace can be designed more easily.

Generally, silicon monocrystal of the present invention can be produced all over the length of crystal by keeping or gradually decreasing a pulling rate P in the range between Pc and Pi, or Pc.min and Pc.max. This might be related to the fact that crystal get hard to be cooled with growing, and thus a temperature gradient right above the interface along the pulling direction G get constant or decreases relatively, resulting in approximately constant parameter P/G in the above-mentioned theory proposed by Voronkov. Namely, since temperature gradient G get constant or decreases relatively, a pulling rate also needs to be kept constant or be decreased while growing crystal.

EXAMPLES

The following examples and comparative examples are being submitted to further explain the present invention. These examples are not intended to limit the scope of the present invention.

Figure 6:
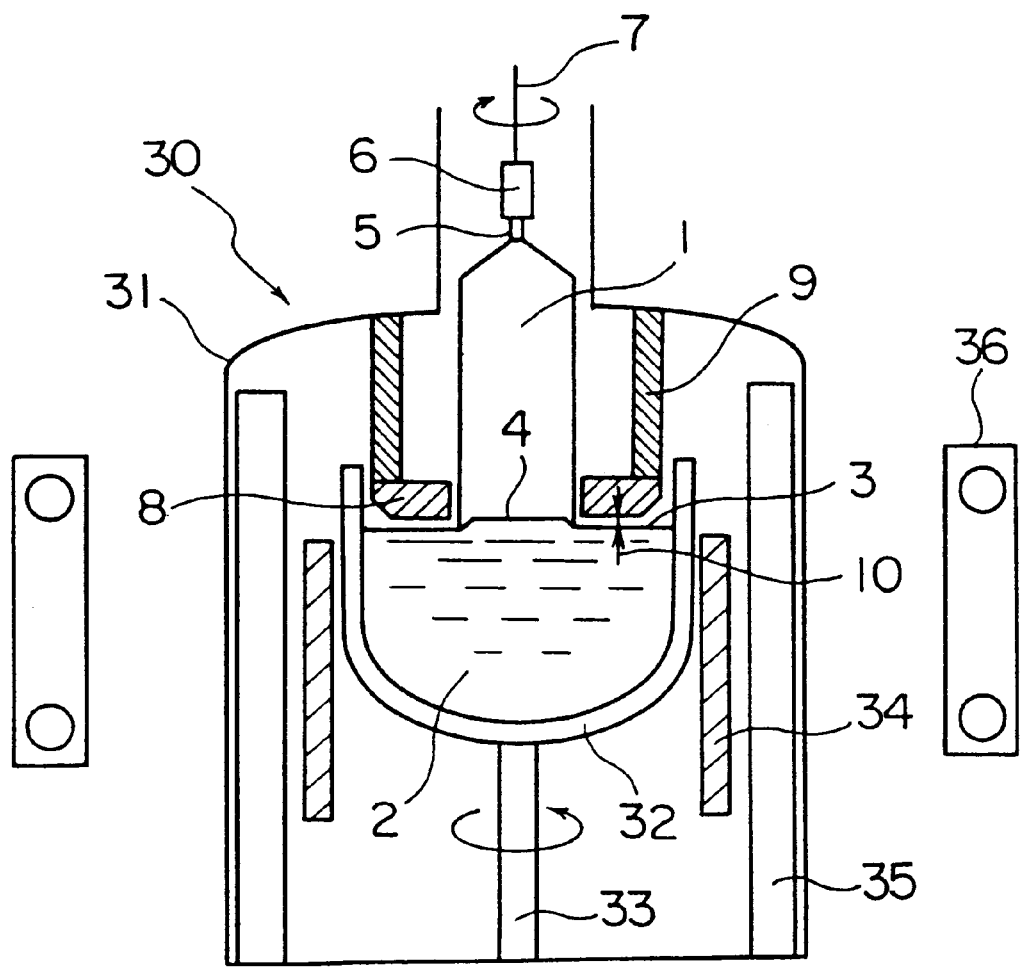
FIG. 6 is a schematic view showing the structure of a monocrystal pulling apparatus operated in accordance with the CZ method and used in the example.

First, the structure of a crystal pulling apparatus used in the present example and operated in accordance with the CZ method will be described with reference to FIG. 6. As shown in FIG. 6, the crystal pulling apparatus 30 includes a pulling chamber 31, a crucible 32 provided within the pulling chamber 31, a heater 34 disposed around the crucible 32, a crucible-holding shaft 33 for rotating the crucible 32 and a rotation mechanism (not shown) for rotating the crucible-holding shaft 33, a seed chuck 6 for holding a silicon seed crystal 5, a cable 7 for pulling the seed chuck 6, and a winding mechanism (not shown) for rotating or winding up the cable 7. The crucible 32 includes an inner quartz crucible for containing a silicon melt 2 and an outer graphite crucible located outside the quartz crucible. A heat insulating cylinder 35 is disposed around the heater 34.

In order to establish operating conditions for the production method of the present invention, an annular solid-liquid interface insulator 8 is arranged around the solid-liquid interface of a single crystal, and at the lower end of an gas flow-guide cylinder. The solid-liquid interface insulator 8 is disposed such that a gap 10 of 3–10 cm is formed between the lower end of the insulator 8 and the surface of the silicon melt 2. A magnet 36 is disposed outside the pulling chamber 31 so as to apply a magnetic field to the silicon melt and thereby suppress convection of the melt.

With the apparatus as shown in FIG. 6, 110 kg of polycrystalline material of silicon was charged into a quartz crucible having a diameter of 22 inches. A silicon material was melt with a heater arranged outside the quartz crucible. A solid-liquid interface insulator disposed above the silicon melt for shield of radiant heat to the crystal and gas flow guide, so that a gap of 5 cm was formed between the bottom end of the interface insulator 8 and surface 3 of the melt 2.

Then, the tip end of the seed crystal 5 is immersed in the silicon melt, left therein for a while, and then pulled gradually to make a neck following to the seed crystal. Subsequently, the diameter of the crystal was gradually increased to the desired diameter, and then the crystal was grown at constant diameter. In the example, the desired diameter was 200 mm.

After the desired length of the body was achieved, the pulling rate of 0.7 mm/min was begun to be decreased at a changing rate γ of 0.005 mm/min/cm per length. While growing the crystal, the quartz crucible was gradually elevated to keep the gap between the melt and solid liquid interface insulator 8. To control change of the temperature due to melt convection and change of the pulling rate, a magnetic field of 4000 G in horizontal direction was applied to the melt. As for heat insulating structure in furnace at the time, a temperature gradient along the pulling direction right above the melt as calculated by heat transfer analysis according to FEMAG was the largest on the surface of the crystal, the smallest at the center of the crystal, the value of η=(Gs−Gc)/min {Gs, Gc} was 0.093.

After the crystal was grown, two sheets of the sample having a thickness of 2 mm were sliced at the position of the diameter, along the pulling direction. They were immersed in a mixed solution of hydrofluoric acid (HF) and nitric acid (HNO$_3$) to remove a processing damage. One of them was etched preferentially with Secco etching for 30 minutes to reveal grown-in defects, and then a density of grown-in defects FPD (an agglomerate of vacancies) and LEP (an agglomerate of interstitial silicon atoms) was measured. The other of them was subjected to heat treatment for oxygen precipitation at 800° C./4 h (N$_2$)+1000° C./16 h(O$_2$). Although there are various sequences as for heat treatment for oxygen precipitation, the above-mentioned sequence is the most suitable to grow the oxide precipitates keeping density of nuclei of oxide precipitate contained in the as-grown crystal. Then, minority carrier lifetime after the oxygen precipitation heat treatment was measured, a photograph was taken with X ray topography.

FIG. 7 is a defect distribution chart provided by determining the strength of contrast in X-ray topography which corresponds to a region of defect and an amount of precipitated oxygen. In FIG. 7, a vertical axis is a position along the pulling direction, namely a pulling rate corresponding to the position. A horizontal axis is a radial position of the crystal. The region A is a region of a grown-in defect FPD. The region B is a region of a ring OSF. The region C is a region where there is no defect, but amount of precipitated oxygen is large. The region D is a region where there is no defect, and amount of precipitated oxygen is small (the region of quality of the present invention). The region E is a region where oxygen precipitation slightly occurs. The region F is a region of a grown-in defect LEP.

In FIG. 7, the results of measurement of a lifetime is shown together. In the region C, lifetime is the lowest, reflecting that oxide precipitate is present in high density. In the region D, lifetime is the highest, reflecting that there is no defect, and formation of oxide precipitate is suppressed.

As shown in FIG. 7, Pc.min corresponding to the latest point in the boundary between the region C and the region D, namely the boundary between the region where excess vacancies are present, but grown-in defect FPD is not present and the region where interstitial silicon atoms are present, but an aggregate thereof is not present is determined. Pi.max corresponding to the earliest point in the boundary between the region D and the region F, namely the boundary corresponding to the region E is determined. In this case, Pi.max is a value at the center of the crystal. These value is as follows:

Pc.min=0.504 mm/min, Pi.max=0.488 mm/min, Pc=0.510 mm/min.

Then, a crystal was grown using the same pulling apparatus and heat insulating structure in furnace as above with controlling a pulling rate in the range between Pc.min =0.504 mm/min and Pi.max =0.488 mm/min, which are the value determined above. The resultant crystal was determined as for grown-in defects in the same manner as above. It was confirmed that all over the body of crystal grown with controlling the pulling rate was the region D wherein none of grown-in defects and nuclei of ring OSF was present, and oxygen precipitation was suppressed. Amount of precipitated oxygen in the sample sliced from the crystal is shown as black circle in FIG. 3

The present invention is not limited to the above-described embodiment. The above-described embodiment is a mere example, and those having the substantially same structure as that described in the appended claims and providing the similar action and effects are included in the scope of the present invention.

For example, in the above-described embodiment, the silicon monocrystal having a diameter of 8 inches was grown. However, the present invention can be applied to a method of pulling a crystal having any diameter, for example, 6 inches or less, 8 to 16 inches, or more.

Furthermore, the present invention can be applied to any type of pulling apparatuses, and any type of furnace structures regardless of applying a magnetic field or not, so long as a pulling rate can be controlled. In the case that a magnetic field is applied, the present invention can be applied to not only a method in which a horizontal magnetic field, but also a method in which a vertical magnetic field or a cusp magnetic field is applied to silicon melt.

Moreover, in order to produce a crystal having only D region which is a quality of the present invention, not only a pulling rate, but also temperature gradient in crystal G or other factors can be controlled. Namely, the present invention does not intended to exclude controlling such factors.

What is claimed is:

1. A method for producing a silicon monocrystal by Czochralski method comprising growing crystal in the region where excess interstitial silicon atoms are present, but an agglomerate thereof is not present.

2. A silicon monocrystal produced by the method of claim 1.

3. A silicon monocrystal wafer obtained from a silicon monocrystal produced by the method of claim 2.

4. A method for producing a silicon monocrystal according to Czochralski method comprising growing crystal with controlling a pulling rate between a transition pulling rate Pc at which there is caused a transition from a region where excess vacancies are present, but grown-in defect is not present to a region where excess interstitial silicon atoms are present, but an agglomerate thereof is not present, and a transition pulling rate Pi from a region where excess interstitial silicon atoms are present, but an agglomerate thereof is not present to a region where an agglomerate of interstitial silicon atoms is present.

5. The method for producing a silicon monocrystal according to claim 4 wherein, in the case that a transition point from a region where excess vacancies are present, but grown-in defect is not present to a region where excess interstitial silicon atoms are present, but an agglomerate thereof is not present varies depending on a radial position of the crystal, a crystal is grown with controlling a crystal pulling rate in the range between the lowest transition pulling rate among the transition pulling rate corresponding to the transition point (Pc. min) and the highest transition pulling rate among the transition point from a region where excess interstitial silicon atoms are present, but an agglomerate thereof is not present to a region where an agglomerate of interstitial silicon atoms is present (Pi max).

6. The method for producing a silicon monocrystal according to claim 5 wherein the rate of the difference between the maximum in a radial direction of a temperature gradient right above the interface between the silicon melt and the crystal along the pulling direction G (G max) and the minimum thereof (G min) to the G min is 20% or less.

7. The method for producing a silicon monocrystal according to claim 6 wherein the value of Pc and Pi; as well as Pc.max, Pc.min, and Pi.max is determined by growing a monocrystal by pulling a crystal with gradually lowering a pulling rate in pulling of monocrystal which is performed in advance, slicing a sample at a longitudinal section which passes through a central axis of the crystal and is parallel to an axial direction of crystal growth, subjecting it to an etching treatment in order to eliminate a surface damage, followed by subjecting it to a heat treatment for oxygen precipitation, and then determining distribution of defect in the sample, or measuring lifetime of minority carrier to determine the distribution of the lifetime in the sample.

8. The method for producing a silicon monocrystal according to claim 5 wherein the value of Pc and Pi; as well as Pc.max, Pc.min, and Pi.max is determined by growing a monocrystal by pulling a crystal with gradually lowering a pulling rate in pulling of monocrystal which is performed in advance, slicing a sample at a longitudinal section which passes through a central axis of the crystal and is parallel to an axial direction of crystal growth, subjecting it to an etching treatment in order to eliminate a surface damage, followed by subjecting it to a heat treatment for oxygen precipitation, and then determining distribution of defect in the sample, or measuring lifetime of minority carrier to determine the distribution of the lifetime in the sample.

9. The method for producing a silicon monocrystal according to claim 4 wherein, in the case that the transition point from a region where excess vacancies are present, but grown-in defect is not present to a region where excess interstitial silicon atoms are present, but an agglomerate thereof is not present varies depending on a radial position of the crystal, the rate of difference between the highest transition pulling rate among the transition point corresponding to the transition point(Pc max) and the lowest transition pulling rate (Pc. min) to Pc. min is 0 to 7%.

10. The method for producing a silicon monocrystal according to claim 5 wherein, in the case that the transition point from a region where excess vacancies are present, but grown-in defect is not present to a region where excess interstitial silicon atoms are present, but an agglomerate thereof is not present varies depending on a radial position of the crystal, the rate of difference between the highest transition pulling rate among the transition point corresponding to the transition point(Pc max) and the lowest transition pulling rate (Pc. min) to Pc. min is 0 to 7%.

11. The method for producing a silicon monocrystal according to claim 10 wherein the rate of the difference between the maximum in a radial direction of a temperature gradient right above the interface between the silicon melt and the crystal along the pulling direction G (G max) and the minimum thereof (G min) to the G min is 20% or less.

12. The method for producing a silicon monocrystal according to claim 11 wherein the value of Pc and Pi; as well as Pc.max, Pc.min, and Pi.max is determined by growing a monocrystal by pulling a crystal with gradually lowering a pulling rate in pulling of monocrystal which is performed in advance, slicing a sample at a longitudinal section which passes through a central axis of the crystal and is parallel to an axial direction of crystal growth, subjecting it to an etching treatment in order to eliminate a surface damage, followed by subjecting it to a heat treatment for oxygen precipitation, and then determining distribution of defect in the sample, or measuring lifetime of minority carrier to determine the distribution of the lifetime in the sample.

13. The method for producing a silicon monocrystal according to claim 10 wherein the value of Pc and Pi; as well as Pc.max, Pc.min, and Pi.max is determined by growing a monocrystal by pulling a crystal with gradually lowering a pulling rate in pulling of monocrystal which is performed in advance, slicing a sample at a longitudinal section which passes through a central axis of the crystal and is parallel to an axial direction of crystal growth, subjecting it to an etching treatment in order to eliminate a surface damage, followed by subjecting it to eliminate a heat treatment for oxygen precipitation, and then determining distribution of defect in the sample, or measuring lifetime of minority carrier to determine the distribution of the lifetime in the sample.

14. The method for producing a silicon monocrystal according to claim 9 wherein the rate of the difference between the maximum in a radial direction of a temperature gradient right above the interface between the silicon melt and the crystal along the pulling direction G (G max) and the minimum thereof (G min) to the G min is 20% or less.

15. The method for producing a silicon monocrystal according to claim 14 wherein the value of Pc and Pi; as well as Pc.max, Pc.min, and Pi.max is determined by growing a monocrystal by pulling a crystal with gradually lowering a pulling rate in pulling of monocrystal which is performed in advance, slicing a sample at a longitudinal section which passes through a central axis of the crystal and is parallel to an axial direction of crystal growth, subjecting it to an etching treatment in order to eliminate a surface damage, followed by subjecting it to a heat treatment for oxygen precipitation, and then determining distribution of defect in the sample, or measuring lifetime of minority carrier to determine the distribution of the lifetime in the sample.

16. The method for producing a silicon monocrystal according to claim 9 wherein the value of Pc and Pi; as well as Pc.max, Pc.min, and Pi.max is determined by growing a monocrystal by pulling a crystal with gradually lowering a pulling rate in pulling of monocrystal which is performed in advance, slicing a sample at a longitudinal section which passes through a central axis of the crystal and is parallel to an axial direction of crystal growth, subjecting it to an etching treatment in order to eliminate a surface damage, followed by subjecting it to a heat treatment for oxygen precipitation, and then determining distribution of defect in the sample, or measuring lifetime of minority carrier to determine the distribution of the lifetime in the sample.

17. The method for producing a silicon monocrystal according to claim 4 wherein the rate of the difference between the maximum in a radial direction of a temperature gradient right above the interface between the silicon melt and the crystal along the pulling direction G (G max) and the minimum thereof (G min) to the G min is 20% or less.

18. The method for producing a silicon monocrystal according to claim 17 wherein the value of Pc and Pi; as well as Pc.max, Pc.min, and Pi.max is determined by growing a monocrystal by pulling a crystal with gradually lowering a pulling rate in pulling of monocrystal which is performed in advance, slicing a sample at a longitudinal section which passes through a central axis of the crystal and is parallel to an axial direction of crystal growth, subjecting it to an etching treatment in order to eliminate a surface damage, followed by subjecting it to a heat treatment for oxygen precipitation, and then determining distribution of defect in the sample, or measuring lifetime of minority carrier to determine the distribution of the lifetime in the sample.

19. The method for producing a silicon monocrystal according to claim 4 wherein the value of Pc and Pi; as well as Pc.max, Pc.min, and Pi.max is determined by growing a monocrystal by pulling a crystal with gradually lowering a pulling rate in pulling of monocrystal which is performed in advance, slicing a sample at a longitudinal section which passes through a central axis of the crystal and is parallel to an axial direction of crystal growth, subjecting it to an etching treatment in order to eliminate a surface damage, followed by subjecting it to a heat treatment for oxygen precipitation, and then determining distribution of defect in the sample, or measuring lifetime of minority carrier to determine the distribution of the lifetime in the sample.

20. A silicon monocrystal wafer produced by Czochralski method containing excess interstitial silicon atoms through the whole area of the wafer, containing no extraordinary oxygen precipitation region due to excess vacancies, containing none of grown-in defect which is an agglomerate of vacancies, an agglomerate of interstitial silicon atoms, and crystal defect which is to be a nuclei of oxidation-induced stacking fault formed on thermal oxidation treatment.

* * * * *